United States Patent [19]
Bruch et al.

[11] Patent Number: 5,738,538
[45] Date of Patent: Apr. 14, 1998

[54] ELECTRICAL UNIT

[75] Inventors: Helmut Bruch; Michael Kneier; Karl Schrödinger; Klaus Schulz, all of Berlin, Germany

[73] Assignee: Siemens Aktiengesellschaft, Munich, Germany

[21] Appl. No.: 639,295

[22] Filed: Apr. 25, 1996

Related U.S. Application Data

[63] Continuation of PCT/DE94/01082, Sep. 6, 1994, published as WO95/12227, May 4, 1995.

[51] Int. Cl.$^6$ .................................................. H01R 13/62
[52] U.S. Cl. .................................................. 439/160; 439/74
[58] Field of Search .................................... 439/74, 75, 157, 439/159, 160, 928, 65; 361/785

[56] References Cited

U.S. PATENT DOCUMENTS

| 3,944,311 | 3/1976 | Sprenkle et al. | 439/157 |
|---|---|---|---|
| 4,480,885 | 11/1984 | Coppelman | 439/159 |
| 4,750,091 | 6/1988 | Van Hout | 361/395 |
| 4,954,298 | 9/1990 | Jullien | 439/160 |
| 5,069,522 | 12/1991 | Block et al. | 385/39 |
| 5,329,428 | 7/1994 | Block et al. | 439/75 |
| 5,628,637 | 5/1997 | Pecone et al. | 439/74 |

FOREIGN PATENT DOCUMENTS

| 22 21 995 | 3/1983 | Germany . |
| 32 43 309 | 7/1986 | Germany . |
| 91 14 294 | 3/1992 | Germany . |
| 2 115 239 | 9/1983 | United Kingdom . |
| 93/18559 | 9/1993 | WIPO . |

Primary Examiner—Neil Abrams
Assistant Examiner—Brian J. Biggi
Attorney, Agent, or Firm—Herbert L. Lerner; Laurence A. Greenberg

[57] ABSTRACT

An electrical unit includes a printed circuit board having a multi-pole plug and a main board having body edges and a plug to be connected to the multi-pole plug in a plug connection. A frame for receiving the printed circuit board has opposed sides and catch lugs being disposed on the opposed sides. The catch lugs have catch elements and the catch lugs are elastically deformed by the body edges upon connection of the plug of the main board to the multi-pole plug. A release lever is supported on the frame and has at least one pressure surface to be pivoted out of a connected position in which the catch elements are latched fixingly to the main board and into a release position in which the at least one pressure surface is braced against the main board for generating a force to undo the plug connection.

9 Claims, 2 Drawing Sheets

ELECTRICAL UNIT

CROSS-REFERENCE TO RELATED APPLICATION

This application is a Continuation of International application Ser. No. PCT/DE94/01082, filed Sep. 6, 1994, published as WO95/12227, May 4, 1995.

BACKGROUND OF THE INVENTION

Field of the Invention

The invention relates to an electrical unit having a printed circuit board with a multi-pole plug which can be connected to a corresponding plug of a main board, and a release lever with at least one pressure surface, which can be pivoted out of a connected position and into a release position, in which the pressure surface is braced against the main board and generates a force that undoes the plug connection.

In electrical engineering, for instance in optical transmission technology, there is a need for electrically and mechanically connecting electrical units having a printed circuit board and a multi-pole plug, to a main board in a reliable way. It is fundamentally known to create the electrical connection through the use of corresponding plugs. The use of catch lugs with terminal catch elements is known from German Patent DE 32 43 309 C2, for mechanical connection of a receptacle for an optical plug prong to a main board. The catch elements are thrust through suitable openings in the main board, causing elastic deformation of the catch lugs, and the openings are dimensioned in such a way that in the connected state the catch elements latch fixingly onto the main board.

Published International Patent Application WO 93/18559 discloses an electrical and mechanical connection of a printed circuit board of an electric module with a main board. The printed circuit board is introduced into a separate base fixed on the main board and is retained at right angles to the main board. In order to fix the module, catch elements disposed on the module side latch in corresponding detent receptacles of the separate base. The electrical connections are made through the use of single contacts resting resiliently on contact surfaces of the printed circuit board, so that hardly any tensile forces need to be exerted to loosen the electrical connection.

A pluggable connection unit having one side on which electrical connection lines are disposed and an opposite side on which a throw-out lever is pivotably supported, is known from German Utility Model G 91 14 294.6 U1. Upon pivoting of the lever, a cam-like surface of the lever is braced, for instance, on a flat component (main board) and thereby undoes a plug connection existing between the unit and the flat component. Secure fastening of the unit in every instance of operation, especially when it is disposed on the underside of the flat component, is not assured.

In order to provide electrical and mechanical connection of a printed circuit board that has a contact strip on its end surface, to a main board, German Patent DE 22 21 995 C2 discloses a device with guides mounted on the main board or on an apparatus frame and levers supported on the guides in a rotatable manner. The levers each have a slit, with which a respective bolt fastened to the printed circuit board can be made to engage, so that the printed circuit board, as a result of the lever motion, can be moved at right angles to the main board, thus making or undoing the electrical connection. In order to move the lever, considerable free space is necessary laterally beside the printed circuit board.

Published UK Patent Application GB 2 115 239 A discloses an electrical and mechanical connection of a hybrid printed circuit board, having contact spots disposed on at least two side edges, to a main board. To that end, the printed circuit board is inserted into a frame, having side walls which are provided on the inside with resilient contact lugs corresponding to the contact spot. At least one pivotable lever is supported on the frame, and the frame is permanently connected to the main board. The lever is pivoted in order to insert the printed circuit board or remove it from the frame. Forces exerted by the lever act only in the edge region and directly on the printed circuit board, causing bending strain on the printed circuit board.

When a component unit having a multi-pole plug is removed, tensile forces must be exerted to loosen it. In the case of a multi-pole plug, those forces can certainly be in the range of 100N, and in terms of force induction can represent a considerable (bending) strain on the component unit. The relatively high mechanical connecting forces generated by the plug are only locally operative in the region of the plug connection. Conversely, the other regions of the component unit may possibly be inadequately well-fixed when external mechanical strains are involved. Damage-free removal, for instance for servicing or repair, is problematic, particularly with a very closely spaced configuration and disposition of component units on both sides of the main board.

SUMMARY OF THE INVENTION

It is accordingly an object of the invention to provide an electrical unit, which overcomes the hereinafore-mentioned disadvantages of the heretofore-known devices of this general type, which can be reliably connected electrically and mechanically to a main board in a simple way and which is relatively easy to remove from the main board with a simple construction.

With the foregoing and other objects in view there is provided, in accordance with the invention, an electrical unit, comprising a printed circuit board having a multi-pole plug; a main board having body edges and having a plug to be connected to the multi-pole plug in a plug connection; a frame for receiving the printed circuit board, the frame having opposed sides, catch lugs being disposed on the opposed sides, the catch lugs having catch elements, the catch lugs being elastically deformed by the body edges upon connection of the plug of the main board to the multi-pole plug; and a release lever being supported on the frame and having at least one pressure surface to be pivoted out of a connected position in which the catch elements are latched fixingly to the main board and into a release position in which the at least one pressure surface is braced against the main board for generating a force to undo the plug connection.

Push-off forces generated by the release lever may be dimensioned to be so great that the catch lugs are also elastically deformed and brought out of engagement with the body edges, simultaneously with the undoing of the plug connection. To that end, the catch elements may have oblique surfaces on their contact zones with the main board, which surfaces enable unlatching when certain push-off forces are exerted.

In accordance with another feature of the invention, in addition or as an alternative, the catch lugs may be assigned actuation surfaces, onto which forces can be brought to bear manually and/or by an extension of the release lever in the release position that unlatch the catch elements.

One essential advantage of the unit of the invention is that in addition to the necessary elements (namely of the plug and the catch lugs) required to assure a secure mechanical and electrical connection, the release lever provided for unlatching and for pushing the unit off from the main board is also a component that is connected to the unit, which is thus always ready for use. The mechanical connection of the removable unit according to the invention to the main board can be performed without additional screws, nuts or spacer bushes, so that in the removed state no individual fastening parts that have to be handled are set free. If two catch lugs with associated actuating surfaces are used, then in order to unlatch the catch elements a person can press on the two actuating surfaces with the fingers of one hand. In terms of the strain on the material, this assures an especially advantageous, purposeful and precisely determinable motion of the catch lugs. The release lever can be pivoted into the release position with the other hand. This pivoting motion generates a separating force acting at right angles to the main board. The pressure surface or surfaces of the release lever can be braced directly on the main board or on an especially constructed bearing surface of the main board. As a result, in the separation operation, the electrical unit undergoes a comparatively slight total mechanical load. The unit according to the invention requires hardly any lateral access space for removal, so that a plurality of units can be disposed not only comparatively close together but also one above the other on the main board (high packing density).

In accordance with a further feature of the invention, which is operative when manual force is exerted on the actuating surfaces, the catch lugs have unlocking levers, which extend outward from the long sides of the frame and away from the printed circuit board, and have outward-pointing surfaces which are the actuating surfaces. In order to further increase the lateral packing density, the actuating surfaces can each be cranked inward.

In accordance with an added feature of the invention, in order to enable the unlocking levers to be simply constructed as plastic injection-molded parts in an advantageous way from a production standpoint, and to avoid errors in manipulation during the removal, the unlocking levers are constructed substantially as straight, three-sided prisms, and each laterally outward-pointing side thereof forms the actuating surface, with a spacing between the particular side surface facing toward the printed circuit board and the printed circuit board itself being dimensioned in accordance with a desired maximum deflection of the catch lugs.

In accordance with an additional feature of the invention, an especially easy-to-manipulate embodiment provides that the release lever is supported on the long sides of the frame and includes a bracket extending substantially between the long sides.

In accordance with yet another feature of the invention, that is preferable from a production standpoint, and with which the frame can be made as a one-piece plastic injection-molded part, the catch lugs are constructed integrally with the respective long side of the frame, and the cross section of the long side of the frame is reduced on both sides of the catch lug.

In accordance with a concomitant feature of the invention, in order to enable placing two electrical units approximately in coincident positions on either side of the main board, a mutually offset configuration of the catch lugs formed on opposed long sides of the frame is provided.

Other features which are considered as characteristic for the invention are set forth in the appended claims.

Although the invention is illustrated and described herein as embodied in an electrical unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
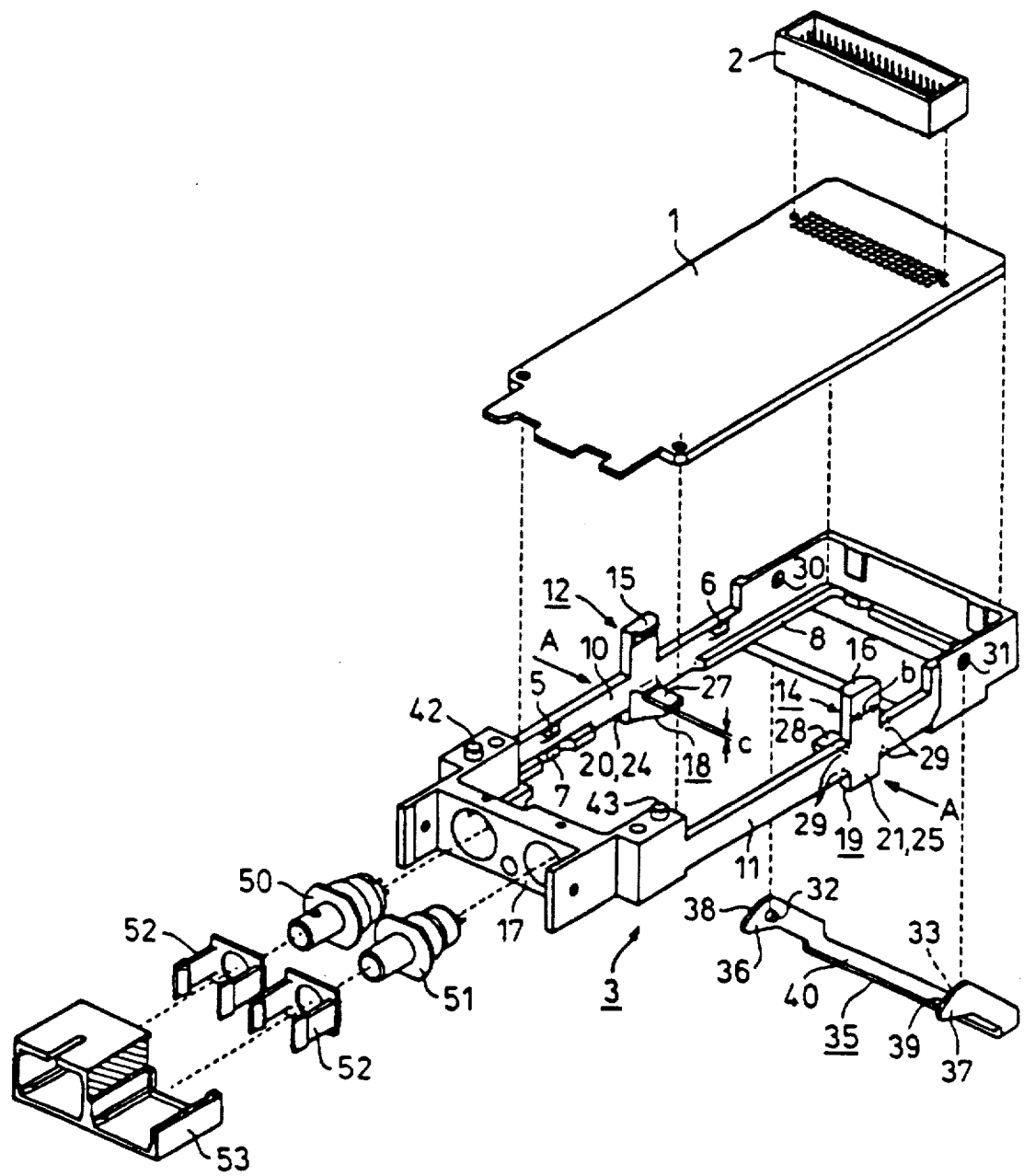
FIG. 1 is a diagrammatic, exploded, perspective view of an electrical unit of the invention.

Referring now to the figures of the drawings in detail and first, particularly, to FIG. 1 thereof, there is seen an electrical unit which includes a printed circuit board 1 with an 80-pole plug 2 and a frame 3 that has catch protrusions 5, 6 and bearing surfaces 7, 8. The printed circuit board 1 is inserted into the frame 3 by exerting slight pressure, so that opposed long sides 10, 11 of the frame and/or the catch or detent protrusions 5, 6 deform slightly elastically, causing the printed circuit board 1 to latch into place between the detent protrusions 5, 6 and the bearing surfaces 7, 8.

Each long side 10, 11 of the frame includes one catch lug 12, 14 having an end with a catch element 15, 16 thereon in the form of a detent hook pointing into an interior of the frame. The catch lug 12 is disposed closer to an end surface 17 of the frame than the catch lug 14, by at least the amount of a width b of a catch lug 12, 14, so that the catch lugs 12, 14 are disposed mutually offset. The elastically deformable catch lugs 12, 14 extend beyond the long sides 10, 11 of the frame and terminate in unlocking levers 18, 19. The unlocking levers 18, 19 are constructed substantially as straight prisms with an approximately triangular bases (three-sided prisms). Sides 20, 21 of the prisms that each point laterally outwardly from the frame 3 form actuating surfaces 24, 25, onto which forces acting manually by finger pressure in the direction of arrows A can be exerted. The actuating surfaces may alternatively be disposed on the outsides of the long sides 10, 11 of the frame, so that the unlocking levers 18, 19 can be dispensed with. Sides 27, 28 of the unlocking levers 18, 19 which face toward the printed circuit board 1 extend, in a position of repose, at a predetermined spacing distance c from and approximately parallel to a lower surface of the printed circuit board 1. The spacing distance c is dimensioned in such a way that given an adequate unlocking motion of the catch lugs 12, 14, their deflection is limited by contact of the sides 27, 28 with the printed circuit board 1.

The frame 3 has openings 30, 31 formed therein, into which tangs 32, 33 of a release lever 35 are supported (FIG. 1 only explicitly shows the tang 32). The release lever 35 has two side parts 36, 37 with pressure surfaces 38, 39 and a bracket 40 interconnecting the side parts 36, 37.

The frame 3 has tangs 42, 43 in the vicinity of its end surface 17. The long sides 10, 11 of the frame may (as suggested for the catch lug 14 in the drawing) have notches 29 formed in both sides of the catch lugs 12, 14, which reduce the cross section of the material of the applicable long side 10, 11 in order to make the catch lug motion easier. Optoelectronic components 50, 51 (optical transmitters and receivers) and locking elements 52 are disposed along with a cover 53 at an end surface of the frame 3.

Figure 2:
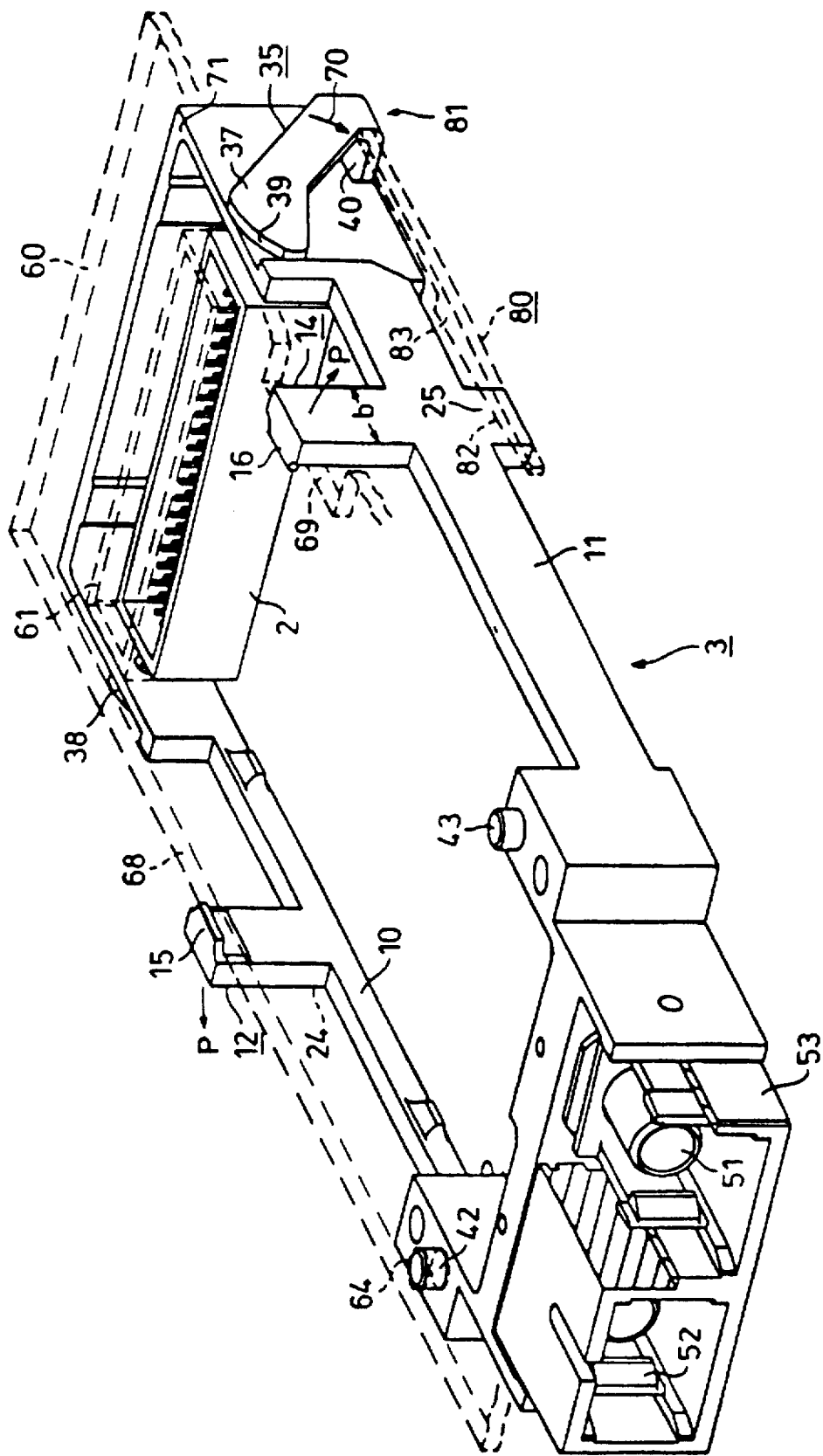
FIG. 2 is an enlarged, perspective view of the unit in a state in which it is connected to a main board.

FIG. 2 shows the electrical unit which was described in detail in conjunction with FIG. 1, in a state in which it is connected to a main board 60, that is shown merely in suggested fashion with dashed lines. The main board 60 includes a (suggested) plug 61 corresponding to the multi-pole plug 2 and has openings 64 (FIG. 2 shows only one opening) formed therein for the tangs 42, 43. The tangs 42, 43 in cooperation with the openings 64 in the main board 60 absorb any forces that arise, upon insertion and removal of plug elements into and from the optoelectcronic components 50, 51. Upon connection of the plugs 2, 61, the catch lugs 12, 14 are elastically deformed by body edges 68, 69 of the main board 60. The body edges 68, 69 may be circumferential edges of the main board, or edges of openings intended for the catch lugs. The catch elements 15, 16 may be beveled slightly at the top to facilitate the latching operation. In the connected state, the catch elements 15, 16 engage the main board from behind and thus lock the unit to the main board 60.

In order to release (remove) the unit from the connected state, a single person can press with the fingers of one hand onto the actuating surfaces 24, 25, causing the catch lugs 12, 14 to move outward (in the direction of arrows P), so that the catch elements 15, 16 release the main board 60 and are brought out of engagement with the body edges 68, 69 (unlatching). Simultaneous motion of the bracket 40 in the direction of an arrow 70 causes the pressure surfaces 38, 39 to rise at least partially above a surface 71 of the frame 3 resting against the main board 60 and then be braced on the main board 60. As a result, a force acting at right angles between the main board 60 and the unit is generated, which undoes the plug connection counter to the comparatively high connection forces. As a result, easily controlled release and removal of the unit is made possible without additional utensils or devices and can be performed by a single person.

In an alternative embodiment, in contrast to the details shown explicitly in the drawing, the catch lugs 12, 14 may also terminate directly at the lower edge of the long sides 10, 11 of the frame, in terms of the drawings. The unlocking levers 18, 19 are then dispensed with. In this variant, the catch elements 15, 16 can have contact surfaces facing toward the main board 60 shown in FIG. 2, that converge obliquely upward at the top, preferably at an ascending angle of 15° relative to the horizontal. Through the use of these beveled surfaces, the catch lugs 12, 14 are deformed elastically, solely by the motion of the bracket 40 and the attendant, above-described action of the pressure surfaces 38, 39. The deformation is great enough to ensure that they are brought out of engagement with the body edges of the main board for the purposes of unlatching.

As can be seen particularly from FIG. 2, the pivot axis of the release lever 35 and the geometry of is side parts 36, 37 with the pressure surfaces 38, 39 are dimensioned in such a way that the forces acting at right angles between the main board 60 and the unit, for loosening the plug connection and optionally unlocking the catch lugs 12, 14, engage essentially symmetrically and along side the narrow sides of the plug 2 or 61. As a result, the forces generated by the motion of the assembly lever engage directly in the vicinity of the plug, without generating eccentric forces and resultant tilting moments, that are a burden to the removal operation and to the unit.

FIG. 2 shows a further variant embodiment with an extension 80 of the release lever 35 indicated in dashed lines. This extension is joined to the side part 37 and is oriented in such a way that when the release or removal lever 35 is pivoted out of a connection position 81 shown in FIG. 2) into a release position, a beveled surface 82 of a thickened region 83 acts upon the actuating surface 25 and thus causes the catch lug 14 to yield resiliently in the direction of the arrow P. Depending on the construction and layout of the release lever 35, the lever path, and the width b of the catch lugs, the extension 80 may also be guided on the frame 3 and be connected in a pivotably articulated manner to the side part 37. The side part 36 shown in FIG. 1 may likewise be provided with a corresponding extension, so that the motion of the release lever 35 into the release position simultaneously causes the resilient yielding of both or even additional catch lugs. As a result of the offset configuration of the catch lugs 12, 15, two units at a time can be disposed on the main board which are rotated 180° from one another.

We claim:

1. An electrical unit, comprising:

a printed circuit board having a multi-pole plug;

a main board having body edges and having a plug to be connected to said multi-pole plug in a plug connection;

a frame for receiving said printed circuit board, said frame having opposed sides, catch lugs being disposed on said opposed sides, said catch lugs having catch elements, said catch lugs being elastically deformed by said body edges upon connection of said plug of said main board to said multi-pole plug;

a release lever being supported on said frame and having at least one pressure surface to be pivoted out of a connected position in which said catch elements are latched fixingly to said main board and into a release position in which said at least one pressure surface is braced against said main board for generating a force to undo said plug connection; and actuation surfaces associated with said catch lugs for receiving manual forces in said release position to unlatch said catch elements.

2. The unit according to claim 1, including an extension of said release lever, and said actuation surfaces being associated with said catch lugs receive forces through said extension in said release position to unlatch said catch elements.

3. The unit according to claim 2, wherein said opposed sides of said frame are long sides, said catch lugs have unlocking levers extending outward from said long sides and away from said printed circuit board, and said catch lugs have outer surfaces being said actuating surfaces.

4. The unit according to claim 3, wherein said unlocking levers are substantially straight, at least three-sided prisms, each of said unlocking levers has a laterally outwardly-pointing side forming a respective one of said actuating surfaces, and each of said unlocking levers has a side surface facing toward said printed circuit board and being spaced from said printed circuit board by a distance being dimensioned in accordance with a desired maximum deflection of said catch lugs.

5. The unit according to claim 1, wherein said opposed sides of said frame are long sides, said catch lugs have unlocking levers extending outward from said long sides and away from said printed circuit board, and said catch lugs have outer surfaces being said actuating surfaces.

6. The unit according to claim 5, wherein said unlocking levers are substantially straight, at least three-sided prisms, each of said unlocking levers has a laterally outwardly-pointing side forming a respective one of said actuating surfaces, and each of said unlocking levers has a side surface facing toward said printed circuit board and being spaced from said printed circuit board by a distance being dimensioned in accordance with a desired maximum deflection of said catch lugs.

7. The unit according to claim 1, wherein said opposed sides of said frame are long sides, said catch lugs are each integral with a respective one of said long sides, and said long sides have reduced cross sections on both sides of said catch lugs.

8. The unit according to claim 1, wherein said catch lugs disposed on said opposed sides are offset from one another.

9. An electrical unit, comprising:

a printed circuit board having a multi-pole plug;

a main board having body edges and having a plug to be connected to said multi-pole plug in a plug connection;

a frame for receiving said printed circuit board, said frame having opposed sides, catch lugs being disposed on said opposed sides, said catch lugs having catch elements, said catch lugs being elastically deformed by said body edges upon connection of said plug of said main board to said multi-pole plug;

a release lever being supported on said frame and having at least one pressure surface to be pivoted out of a connected position in which said catch elements are latched fixingly to said main board and into a release position in which said at least one pressure surface is braced against said main board for generating a force to undo said plug connection; and said opposed sides of said frame are long sides, said release lever is supported on said long sides, and said release lever includes a bracket extending substantially between said long sides.

* * * * *

UNITED STATES PATENT AND TRADEMARK OFFICE
CERTIFICATE OF CORRECTION

PATENT NO. : 5,738,538
DATED : April 14, 1998
INVENTOR(S) : Helmut Bruch et al.

It is certified that error appears in the above-identified patent and that said Letters Patent is hereby corrected as shown below:

On the title page,
  Item [30] should be inserted as follows:

Oct. 23, 1993   [DE]   Germany . . . . P43 36 786.0

Signed and Sealed this

Eighth Day of June, 1999

Attest:

Q. TODD DICKINSON

*Attesting Officer*     Acting Commissioner of Patents and Trademarks